US009799457B2

(12) United States Patent
Ramello et al.

(10) Patent No.: US 9,799,457 B2
(45) Date of Patent: Oct. 24, 2017

(54) ELECTRODE FOR SOLAR CELLS AND PREPARATION METHOD

(71) Applicant: ENI S.P.A., Rome (IT)

(72) Inventors: Stefano Ramello, Novara (IT); Paolo Biagini, San Giuliano Terme (IT)

(73) Assignee: Eni S.p.A., Rome (IT)

( * ) Notice: Subject to any disclaimer, the term of this patent is extended or adjusted under 35 U.S.C. 154(b) by 0 days.

(21) Appl. No.: 14/400,921

(22) PCT Filed: Jun. 13, 2013

(86) PCT No.: PCT/IB2013/054834
§ 371 (c)(1),
(2) Date: Nov. 13, 2014

(87) PCT Pub. No.: WO2013/186728
PCT Pub. Date: Dec. 19, 2013

(65) Prior Publication Data
US 2015/0136217 A1    May 21, 2015

(30) Foreign Application Priority Data
Jun. 14, 2012 (IT) .............................. MI2012A1029

(51) Int. Cl.
*H01L 31/0224* (2006.01)
*H01G 9/20* (2006.01)

(52) U.S. Cl.
CPC ......... *H01G 9/2022* (2013.01); *H01G 9/2059* (2013.01); *H01L 31/022425* (2013.01); *H01G 9/2031* (2013.01); *Y02E 10/542* (2013.01)

(58) Field of Classification Search
CPC ... H01L 31/00; H01L 31/02; H01L 31/02002; H01L 31/02008; H01L 31/0216;
(Continued)

(56) References Cited

U.S. PATENT DOCUMENTS

2005/0166959 A1* 8/2005 Lee .................. H01G 9/2031
136/263
2009/0263569 A1* 10/2009 Peng ................. H01M 4/0497
427/77
2011/0272007 A1    11/2011 Kang et al.

FOREIGN PATENT DOCUMENTS

CN        101777428 A    7/2010
DE    102010054274 A1    7/2011

OTHER PUBLICATIONS

International Search Report and Written Opinion dated Aug. 29, 2013 for PCT/IB2013/054834.
(Continued)

*Primary Examiner* — Christina Chern
(74) *Attorney, Agent, or Firm* — Abel Law Group, LLP

(57) ABSTRACT

Electrode comprising a conductive substrate on which a uniform layer of aggregates A, having an average diameter ranging from 40 to 100 nm, is deposited, on which a non-homogeneous distribution of aggregates B, having an average diameter ranging from 300 nm to 1,200 nm, is superimposed, both of said aggregates being composed of particles containing one or more metals Me selected from platinum, palladium and gold, having an average diameter ranging from 8 to 10 nm. The use of said electrode, as cathode, for DSSC devices produces a marked improvement in the performances of the cell with respect to the results that can be obtained with known cathodes.

17 Claims, 4 Drawing Sheets

(58) Field of Classification Search
CPC ........... H01L 31/02167; H01L 31/0224; H01L 31/022425; H01L 31/022491
See application file for complete search history.

(56) References Cited

OTHER PUBLICATIONS

Zhang, et al. "Morphology controllable fabrication of Pt counter electrodes for highly efficient dye-sensitized solar cells," Journal of Materials Chemistry, vol. 22, No. 9, Jan. 1, 2012, p. 3948.
S.S. Kim et al., "Electrodeposited Pt for cost-efficient and flexible dye-sensitized solar cells," Electrochimica Acta, 2006, 51, 3814-3819.
A. Mishra, M. K. R. Fisher, P. Bauerle, "Metal-Free Organic Dyes for Dye-Sensitized Solar Cells: From Structure: Property Relationships to Design Rules" Angew. Chem. Int. Ed. 2009, vol. 48, pp. 2474-2499.
X. Tang et al., "Structural Features and Catalytic Properties of Pt/CeO2Catalysts Prepared by Modified Reduction-Deposition Techniques," Catalysis Letters, vol. 97, Nos. 3-4, 163-169; Dye Sensitized Solar Cells, eds. K. Kalyanasundram, EPFL Press, distributed by CRCC Press, 2010, p. 31.
A. Guhaa et al., "Surface-modified carbons as platinum catalyst support for PEM fuel cells," Carbon, vol. 45, Issue 7, Jun. 2007, 1506-1517.
W. Li et al., "Preparation and Characterization of Multiwalled Carbon Nanotube-Supported Platinum for Cathode Catalysts of Direct Methanol Fuel Cells," J. Phys. Chem. B, 2003, 107, 26, pp. 6292-6299.
M. Grätzel et al., J. Electrochem. Soc., vol. 144, Issue 3, pp. 876-884, 1997.
C. Wang et al., "A General Approach to the Size- and Shape-Controlled Synthesis of Platinum Nanoparticles and their Catalytic Reduction of Oxygen," Angew. Chem. Int. Ed., 2008, 47, 3588-3591.
C.M. Sanchez-Sanchez et al., "Imaging Structure Sensitive Catalysis on Different Shape-Controlled Platinum Nanoparticles," J. Am. Chem. Soc. 2010, 132, 5622-5624.
C. Wang et al., "Synthesis of Monodisperse Pt Nanocubes and Their Enhanced Catalysis for Oxygen Reduction," J. Am. Chem. Soc. 2007, 129, 6974-6975.
K.R. Millington, "Photoelectrochemical Cells, Dye-Sensitized Cells," Encyclopedia of Electrochemical Power Sources, 2009, 4, pp. 10-21.
K. Kalyanasundram, "Dye Sensitized Solar Cells," EPFL Press, distributed by CRCC Press, 2010, pp. 22, 24-30 and p. 235.

* cited by examiner

Electrode for Solar Cells and Preparation Method

Electrode for Solar Cells and Preparation Method

Electrode for Solar Cells and Preparation Method

ELECTRODE FOR SOLAR CELLS AND PREPARATION METHOD

The present invention relates to an electrode for solar cells containing aggregates of Pt, Pd, Au or mixtures thereof, in particular aggregates of Pt, Pd, Au or mixtures thereof deposited on a conductive substrate, and their preparation method. These aggregates have a particular morphology and their use in cathodes for DSSC devices produces a marked improvement in the performances of the cell with respect to the results obtained with known cathodes.

The growing demand for energy is directing research towards the study of new sources, alternative to traditional resources such as, for example, petroleum, gas, coal and nuclear energy. In particular, a subject of increasing importance is the conversion of solar energy to electricity by exploiting new photovoltaic technologies. Silicon photovoltaic cells are evolving towards second-generation technologies, such as, for example, thin layer and focalization of radiation; these technologies are in any case still costly and second-generation technologies are not as yet sufficiently efficient.

The search for valid alternative technologies has led, particularly in the last decade, to the development of what is called the third generation of photovoltaic cells: this definition comprises both photovoltaic cells based on other semiconductors such as metallic selenides and tellurides and also, in particular, so-called organic photovoltaic cells such as those called Graetzel, or "dye sensitized solar cells" DSSCs, or other types of organic and/or polymeric cells such as bulk heterojunctions, BHJ. DSSC cells operate through a mechanism of the photoelectrochemical type. The light absorption and separation of the charges (electrons and holes) take place separately.

The first step is promoted by a layer of dye, i.e. a photosensitizer or dye, which interacts, from the point of view of electron transfer, with the surface of nanometric particles of titanium dioxide as semiconductor, deposited on transparent and conductive glass. When the photosensitizer absorbs radiation, it generates an excited state promoting an electron from the fundamental state of the molecule (HOMO) to the first empty orbital available (LUMO) from which, if the energy levels are compatible, a charge transfer can be effected to the conduction band of the titanium dioxide, on whose surface the photosensitizer is anchored through acid groups (generally carboxylic) present in the molecule. The electron then migrates from the conduction band of the titanium dioxide to the electrode (conductor glass). A positive charge (hole) is contemporaneously transferred from the photosensitizer, in its oxidized form, to a mediator electrolyte which conveys the positive charge to the counter-electrode. These cells are promising due to their low cost, as a result of the production simplicity and good efficiency which currently reaches about 11%, on small-sized cells on a laboratory scale, this percentage referring to the whole solar spectrum.

Ideally, the absorption of the photosensitizer should overlap the solar emission spectrum as much as possible; in this context, various transition metal complexes and also organic dyes have been studied, rationalizing their properties and behaviour thanks to advanced quantum-mechanical calculations. As far as DSSCs are concerned, an important role is exerted by the counter-electrode which must have good electrocatalytic properties (Dye Sensitized Solar Cells, eds. K. Kalyanasundram, EPFL Press, distributed by CRCC Press, 2010, page 30 and page 235). Said counter-electrode is preferably made of platinum (*Photoelectrochemical Cells-Dye-Sensitized Cells*, K. R. Millington, Encyclopedia of Electrochemical Power Sources, 2009, 4, pages 10-21). It is known that the morphology, i.e. the size of the Pt particles and their distribution, plays a fundamental role in determining the performances of the electrode. In many works relating to this field of research, it is indicated that, in order to obtain good performances of the electrode, an accurate control of the morphology of the Pt deposited, is necessary (*Synthesis of Monodisperse Pt Nanocubes and Their Enhanced Catalysis for Oxygen Reduction*, C. Wang et al., J. Am. Chem. Soc. 2007, 129, 6974-6975; *Imaging Structure Sensitive Catalysis on Different Shape-Controlled Platinum Nanoparticles*, C. M. Sanchez-Sanchez et al., J. Am. Chem. Soc. 2010, 132, 5622-5624; *A General Approach to the Size-and Shape-Controlled Synthesis of Platinum Nanoparticles and their Catalytic Reduction of Oxygen*, C. Wang et al., Angew. Chem. Int. Ed., 2008, 47, 3588-3591).

M. Grätzel et al., J. Electrochem. Soc., Volume 144, Issue 3, pages 876-884, 1997, describe Pt nanoparticles of about 5 nm obtained by thermal decomposition of $H_2PtCl_6$, dissolved in isopropanol, carried out at a temperature of 385° C.: these particles provide the best performances among those described in this publication, also thanks to the transparency of the cathode, due to the minimum quantity of Pt used.

In S. S. Kim et al., Electrochimica Acta, 2006, 51, 3814-3819, the performances of two devices with cathodes characterized by drastically different morphologies of Pt deposited, were compared: by means of pulsed electrodeposition, the formation of nanoclusters was observed, having dimensions of less than 40 nm, composed of 3 nm particles, unlike the formation of large aggregates of about 500 nm in diameter observed in the case of direct electrodeposition. The performances of the first electrode proved to be much higher than the second.

In the field of electrocatalysis, it is indicated that the decomposition of Pt precursors into polyalcohols, in particular, ethylene glycol, leads to a uniform particle distribution of the platinum with respect to both the dimensions (<5 nm) and coating of the substrate (*Preparation and Characterization of Multiwalled Carbon Nanotube-Supported Platinum for Cathode Catalysts of Direct Methanol Fuel Cells*, W. Li et al., J. Phys. Chem. B, 2003, 107, 26, pages 6292-6299). In this case, the decomposition takes place at a temperature of 140° C., much lower than the boiling point of ethylene glycol (197° C.). In particular, what is favoured is the nucleation process, to the detriment of the growth process with the result that the agglomeration of the particles is minimized (*Surface-modified carbons as platinum catalyst support for PEM fuel cells*, A. Guhaa et al., Carbon, Volume 45, Issue 7, June 2007, 1506-1517). The materials thus prepared show improved catalytic performances and longer lifetimes. This preparation method is commonly indicated as "polyol process" (*Structural Features and Catalytic Properties of $Pt/CeO_2$Catalysts Prepared by Modified Reduction-Deposition Techniques*, X. Tang et al., Catalysis Letters, Volume 97, Numbers 3-4, 163-169; *Dye Sensitized Solar Cells*, eds. K. Kalyanasundram, EPFL Press, distributed by CRCC Press, 2010, page 31).

Various products are available on the market that allow optimized electrodes to be obtained, such as, for example the solution based on Pt Platisol T of Solaronix, which contains a chemical precursor of Pt dissolved in isopropanol and is deposited by means of screen printing (http://www.solaronix.com/products/platinumcatalysts/platisolt/)

Another widely-used material in laboratories is the paste PT1 (Dyesol) (http://www.dyesol.com/download/Mat- Paste.pdf), based on oily components and which comprises the same method for its deposition.

The Owner has now found that, by means particular deposition process of Pt, Pd or Au, a completely particular morphology of these metals is obtained: the use of electrodes prepared in this way leads to a marked improvement with respect to devices assembled with known materials and methods, obtaining much higher performances in terms of performances and characteristics of DSSC cells containing them as cathodes.

An object of the present invention therefore relates to an electrode comprising a conductive substrate on which a uniform layer of aggregates having an average diameter ranging from 40 to 100 nm, is deposited, on which a non-homogeneous distribution of aggregates having an average diameter ranging from 300 nm to 1,200 nm, is superimposed, both of said aggregates being composed of particles containing one or more metals Me selected from platinum, palladium and gold, having an average diameter ranging from 8 to 10 nm.

In particular, when only one metal Me is present, said particles are all composed of said metal, whereas when two metals Me or three metals Me are present, both monometallic particles, i.e. composed of only one of each of said metals, and multimetallic particles, i.e. composed of mixtures having a variable composition of said metals, are contemporaneously present.

When more than one metal Me is present, the electrode can therefore contain aggregates composed of monometallic particles the same as each other, aggregates composed of monometallic particles that differ in the metal Me, aggregates of multimetallic particles with a variable composition and aggregates composed of monometallic particles and multimetallic particles.

The average diameter of the particles is calculated by assimilating particles with irregular spheres and considering their larger diameter. In these particles, the platinum, palladium or gold are in metal form.

Aggregates having dimensions larger than or equal to 40 nm and less than or equal to 100 nm, hereinafter called aggregates A, are in close contact with the support: the average diameter of these aggregates is calculated by assimilating the aggregates A with irregular spheres and considering their larger diameter. Said aggregates A form a uniform layer on the conductor support, i.e. they completely cover the substrate. The thickness of this layer of aggregates is preferably less than 300 nm, even more preferably less than 100 nm.

A non-homogeneous distribution of aggregates, hereinafter called aggregates B, having an average diameter ranging from 300 nm to 1,200 nm, is superimposed on the aggregates having dimensions larger than or equal to 40 nm: the average diameter of these aggregates is calculated by assimilating the aggregates B with irregular spheres and considering their larger diameter. The distribution of said average diameter is preferably centered on the value of 500 nm.

According to a preferred aspect, the aggregates B have an average diameter ranging from 300 to 100 nm, even more preferably from 300 to 600 nm. A non-homogeneous distribution refers to a distribution of the aggregates B corresponding to only a partial coating of the underlying layer, preferably corresponding to a coating (determined by SEM) of less than 70% of the underlying layer of aggregates A, even more preferably less than 50%.

Substrates that can be conveniently used for the electrodes of the present invention can be selected from glass with conductive coatings (FTC), composites based on plastic polymers or metal laminas.

The composites based on plastic polymers can be for example polyethyleneterephthalate coated with ITO (Indium tin oxide) (PET/ITO) and polyethylenenaphthenate coated with ITO (PEN/ITO), as described, for example, in Dye Sensitized Solar Cells, eds. K. Kalyanasundram, EPFL Press, distributed by CRCC Press, 2010, page 22. The main advantages of this type of substrate are the reduced weight, flexibility and easy scale-up to industrial processes, such as roll-to-roll printing.

With respect to the third type of substrate, the metal laminas can, for example, be titanium, aluminium or stainless steel. The metal laminas have the same advantages as the substrates based on polymers. The conductive substrate preferably used is a TOC (Transparent Conducting Oxide-Glass), where conducting glass means a structure on which a transparent glass substrate is coated with a conducting oxide. The requisites for the TCO substrate are a low electric resistance of the oxide layer and a high transparency to solar radiation in the visible-NIR region. Tin oxide doped with indium (ITO) and tin oxide doped with fluorine (FTO) can be used for the layer of oxide. The preferred TCO substrate for the present invention is FTO.

The electrodes of the present invention are prepared by means of a new deposition method based on the thermal decomposition of one or more precursors containing Pt, Pd or Au: this method is characterized by dissolving the Pt, Pd or Au precursor in a high-boiling solvent, in particular a solvent with a boiling point higher than 200° C., and subjecting the solution to thermal treatment at a temperature higher than the boiling point of said solvent.

A further object of the present invention therefore relates to a method for preparing electrodes comprising a conductive substrate on which a uniform layer of aggregates is deposited, having an average diameter ranging from 40 to 100 nm, on which a non-homogeneous distribution of aggregates is superimposed, having an average diameter ranging from 300 nm to 1,200 nm, both of said aggregates being composed of particles containing one or more metals Me selected from platinum, palladium and gold, having an average diameter ranging from 8 to 10 nm, which comprises:
1. dissolving at least one precursor containing platinum, palladium or gold, in a solvent having a boiling point higher than 200° C.,
2. depositing the solution containing the precursor on the substrate,
3. thermally treating the precursor by heating it to a temperature higher than the boiling point of the solvent used.

In step (1), the solvent used preferably has a boiling point ranging from 220° C. to 300° C. Suitable solvents can, for example, be tetraglyme [CAS 143-24-8], glycerine [CAS 56-81-5] or sulfolane [CAS 126-33-0].

Platinum precursors that can be conveniently used are, for example: $H_2PtCl_6$ [CAS 16941-12-1], $H_2PtCl_4(NH_4)_2$ [13820-41-2], $Pt(acac)_2$. [CAS 15170-57-7].

Palladium precursors that can be conveniently used are, for example: $Pd(acac)_2$ [CAS 140024-61-4] or $H_2PdCl_4(NH_4)_2$[CAS 7647-10-1].

Platinum precursors that can be conveniently used are, for example: $H_2PtCl_6$ [CAS 16941-12-1], $H_2PtCl_4(NH_4)_2$ [13820-41-2], $Pt(acac)_2$. [CAS 15170-57-7].

A gold precursor that can be conveniently used is, for example: $HAuCl_4$ [CAS 169-03-35-8].

When the particle contains more than one metal in the preparation of the electrode, the relative precursors are used, preparing a single solution containing them, to be deposited on the substrate.

The precursor is preferably dissolved in the solvent at a concentration ranging from 0.1 w/w % to 6 w/w %. In the precursor, the Pt can have oxidation number II or IV, the Pd oxidation number II, Au oxidation number I and III; in step (3) the metal contained in the precursor passes to oxidation state 0.

In step (2), the solution is preferably deposited on the conductive support in a thickness of not less than 15 μm.

According to a preferred aspect, once the solution has been deposited, heating in air is effected to a temperature ranging from 60° C. to 130° C. for a time ranging from 0.5 to 20 hours, thus obtaining a viscous paste containing a part of the metal already in oxidation state 0.

In step (3), the thermal treatment is carried out in air. In this step, the temperature is brought to a value higher than the boiling point of the solvent: this causes removal of the solvent and completion of the reduction process of the Pt, Pd or Au contained in the precursor to metallic platinum, palladium or gold, with precipitation and grafting of the particle aggregates containing platinum, palladium, gold or mixtures thereof, on the substrate. Step (3), corresponding to a calcination, is preferably carried out at a temperature at least 100° C. higher than the boiling point of the solvent used, even more preferably at a temperature at least 150° C. higher than the boiling point of the solvent used. Temperature values at which step (3) can be conveniently carried out range from 350 to 600° C. The temperature is preferably reached by heating with a gradient ranging from 1 to 5° C./rain, even more preferably with a gradient ranging from 1.5 to 2.5° C./min. The time required for the thermal treatment of step (3) can range from 1 to 5 hours, preferably from 1 to 3 hours.

The choice of solvent, in terms of boiling point, and relative thermal treatment, is crucial for obtaining the specific new morphology. The use in DSSC cells of electrodes prepared in this way leads to a marked improvement with respect to the use of electrodes prepared by means of known processes, such as, for example, the decomposition of Pt precursors in an alcohol solution. The new electrode allows a cell efficiency to be obtained, that can even be equal to or higher than 8%.

A further object of the present invention therefore relates to the use, as cathode, in DSSC cells, of electrodes having the particular morphology described above. The efficiency results obtained are completely unexpected and surprising, not only because the decomposition process provides highly non-homogeneous distributions, in particular bimodal, characterized by extensive agglomeration of the Pt nanoparticles even when using solvents, such as glycerol, which are normally adopted for specifically preventing aggregation phenomena of the Pt nanoparticles in electrochemical or photocatalytic applications, for example, but above all because much better results are obtained in terms of performances of cells using an electrode thus prepared. By using electrodes prepared according to the method of the present invention, there is an increase not only in the efficiency, but also in the voltage ($V_{oc}$) and Fill Factor (FF). Efficiency refers to the extent of electric power produced per unit of light power inciding on the cell, expressed as percentage. The Fill Factor is the percentage of the ratio between the maximum power that can be obtained in practice and the theoretical value.

A further object of the present invention relates to an organic photovoltaic cell (DSSC) comprising an electrode containing a conductive support, preferably conductive glass, even more preferably glass in which the conductive layer is FTO, on which aggregates are uniformly deposited, having an average diameter ranging from 40 to 100 nm, composed of particles of platinum, palladium or gold having an average diameter ranging from 8 to 10 nm, on which aggregates are superimposed, having an average diameter ranging from 300 nm to 1,200 nm, non-homogeneously distributed, in turn composed of particles containing one or more metals Me selected from Pt, Pd, Au or mixtures thereof, having dimensions ranging from 8 to 10 nm.

An object of the present invention also relates to a method for the conversion of solar energy into electricity using said photovoltaic cell. In addition to the electrode object of the present invention, the cell also contains a semiconductor electrode on which a photosensitizer dye or an electrolyte, containing a redox pair, is grafted.

All known semiconductor electrodes, dyes, electrolytes and redox pairs can be conveniently used in DSSC cells containing the electrode of the present invention. In particular, $TiO_2$, ZnO, CdSe, CdS, can be used as semiconductor electrode, preferably $TiO_2$. The electrolyte can be selected from those well-known to experts in the field, among which, for example, those described in Dye Sensitized Solar Cells (eds. K. Kalyanasundram, EPFL Press, distributed by CRCC Press, 2010, pp. 28-29) and preferably iodine contains a redox pair$I_2/I_3^-$. A typical composition can, for example, contain: N-methyl-N-butylimidazole iodide, iodine, LiI, guanidinium-thiocyanate and tert-butylpyridine, in a mixture, for example 15:85 by volume, of valeronitrile and acetonitrile. The dye can, for example, be selected from those well-known to experts in the field, among which, for example, those described in Dye Sensitized Solar Cells (eds. K. Kalyanasundram, EPFL Press, distributed by CRCC Press, 2010, pages 24-28). Dyes which are widely used are, for example, those belonging to the group of ruthenium (II) di-pyridine complexes, commonly indicated as N719 (di-tetrabutylammonium cis-Bis(isothiocyanate)bis(2,2'-bi-pyridyl-4,4'-dicarboxylate)ruthenium(II), and N3 cis-Bis (isothiocyanate)-bis(2,2'-bipyridyl-4,4'-dicarboxylate) ruthenium(II), or those belonging to the group of metal-free organic dyes, well-known to experts in the field, of which a valid review is contained in "Metal-Free Organic Dyes for Dye-Sensitized Solar Cells: From Structure: Property Relationships to Design Rules" A. Mishra, M. K. R. Fisher, P. Bauerle, Angew. Chem. Int. Ed. 2009, vol. 48, pages 2474-2499.

Some illustrative and non-limiting examples are provided hereunder for a better understanding of the present invention and its embodiments.

EXAMPLES

The following examples were effected so as to exclude any effect that could be linked to the quantity of Pt deposited, consequently allowing only the effect due to the particular morphology to be selected. The samples were therefore prepared from solutions having an equal concentration of precursor, using both solvents having a boiling point higher than 200° C. (examples 1-3), and solvents having a boiling point lower than 200° C. (comparative examples 4-6): the morphology obtained is completely different, and in the comparative examples, the conductive layer is only partially coated (<70%), and the aggregates, deposited on various layers, do not exceed a dimension of 20 nm.

Example 1

Figure 1:
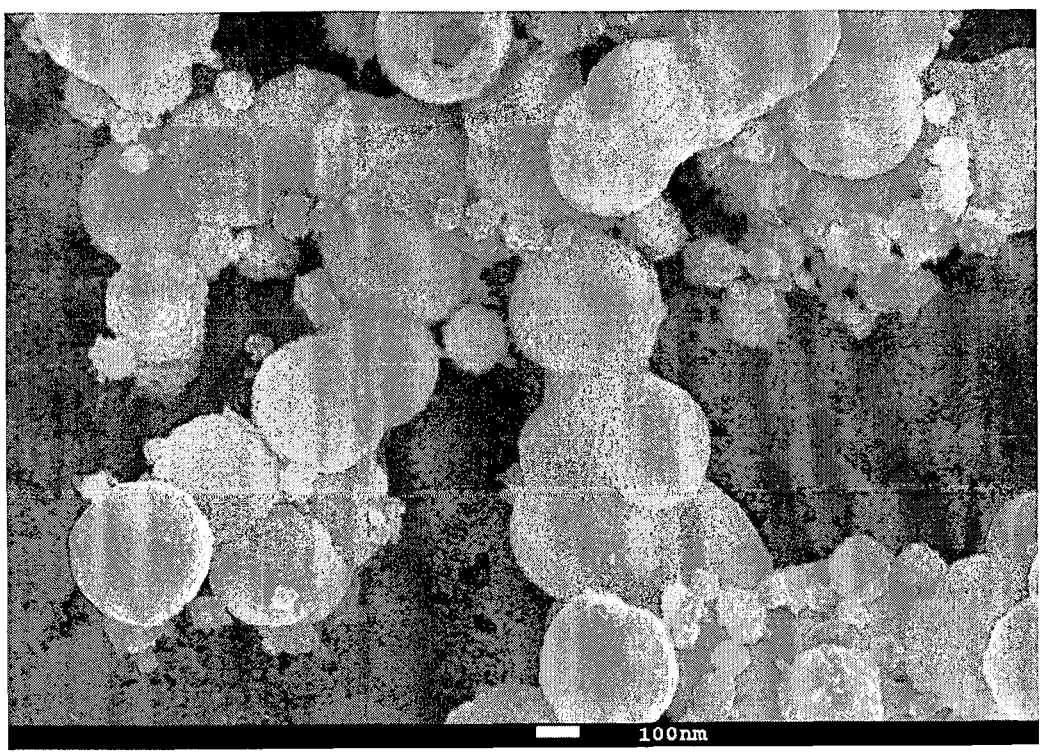
FIG. 1 shows a photograph taken by means of SEM of the sample as described in Example 1 hereunder.

A solution is prepared at 2% by weight of $H_2PtCl_6 \cdot 6H_2O$ in sulfolane (boiling point=285° C.). The solution is deposited on a covered FTO conductive glass (FTO glass 25 cm×25 cm TEC 8 2.3 mm) and the glass is put in an oven for 20 hours at 92° C. The cover is removed, the glass slide is cleaned of any possible glue residues of cellotape and is baked in a muffle with a temperature increase to 400° C. in 3 hours and is finally maintained at 400° C. for 1 hour. FIG. 1 shows a photograph taken by means of SEM of the sample deposited. The FTO layer is completely coated. The morphology of the sample consists of a thin layer, of about 100 nm; of aggregates having dimensions of 40 nm (aggregates A) of particles of Pt, wherein said particles have dimensions of 8-10 nm; this layer perfectly and uniformly covers the FTO conductive substrate. Pt aggregates having an ovoid form, aggregates B, in turn composed of Pt particles having dimensions of 8-10 nm, can be seen on the surface: the aggregates B have an average diameter of 380 nm.

Example 2

Figure 2:
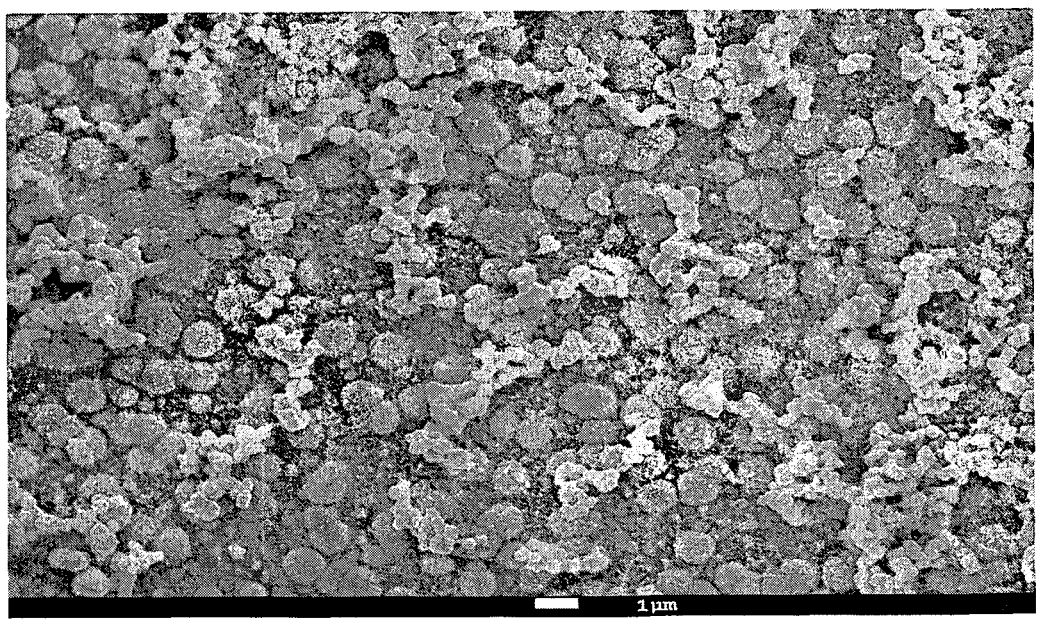
FIG. 2 shows a photograph taken by means of SEM of the sample as described in Example 2 hereunder.

A solution is prepared at 2% by weight of $H_2PtCl_6 \cdot 6H_2O$ in tetraglyme (boiling point=275° C.). The solution is deposited on a covered FTO conductive glass (FTO glass 25 cm×25 cm TEC 8 2.3 mm) and the glass is put in an oven for 20 hours at 100° C. The cover is removed, the glass slide is cleaned of any possible glue residues of cellotape and is baked in a muffle with a temperature increase to 400° C. in 3 hours and is finally maintained at 400° C. for 1 hour. FIG. 2 shows a photograph taken by means of SEM of the sample deposited. The FTO layer is completely coated. The sample has a composite morphology showing a very thin layer (<100 nm) of aggregates A having dimensions equal to 40 nm of Pt particles of 8-10 nm, which decorate and follow the underlying morphology of the conductive glass (FTC)). Aggregates B, having an average diameter of 530 nm and an ovoid form, in turn composed of aggregates of Pt particles of 8-10 nm, can also be seen on the surface.

Example 3

Figure 3:
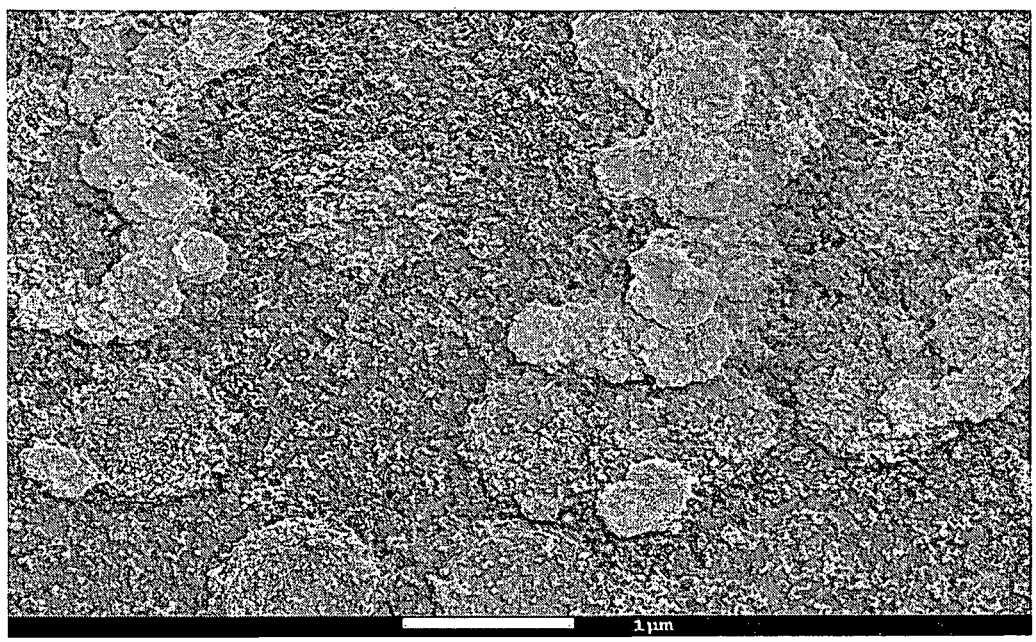
FIG. 3 shows a photograph taken by means of SEM of the sample as described in Example 3 hereunder.

A solution is prepared at 2% by weight of $H_2PtCl_6 \cdot 6H_2O$ in glycerol (boiling point=290° C.). The solution is deposited on a covered FTO conductive glass (FTO glass 25 cm×25 cm TEC 8 2.3 mm) and the glass is put in an oven for 16 hours at 92° C. The cover is removed, the glass slide is cleaned of any possible glue residues of cellotape and is baked in a muffle with a temperature increase to 400° C. in 3 hours and is finally maintained at 400° C. for 1 hour. FIG. 3 shows a photograph taken by means of SEM of the sample deposited. The FTO layer is completely coated. The sample shows a composite morphology consisting of a layer, of about 300 nm, of aggregates A having dimensions equal to 40 nm, composed of Pt particles having dimensions of 8-10 nm, superimposed by aggregates B, having a morphology similar to an irregular sphere having an average diameter equal to 490 nm, in turn composed of Pt particles having dimensions equal to 8-10 nm. The first layer of type A aggregates uniformly covers the conductive substrate.

Example 4—Comparative

A commercial sample Dyesol (Pt-Coated Test Cell Glass Plate) is used, composed of FTO conductive glass (TEC15) on whose surface Pt coming from the thermal decomposition of an oily paste, is deposited (http://www.dyesol.com/download/Catalogue.pdf).

Figure 4:
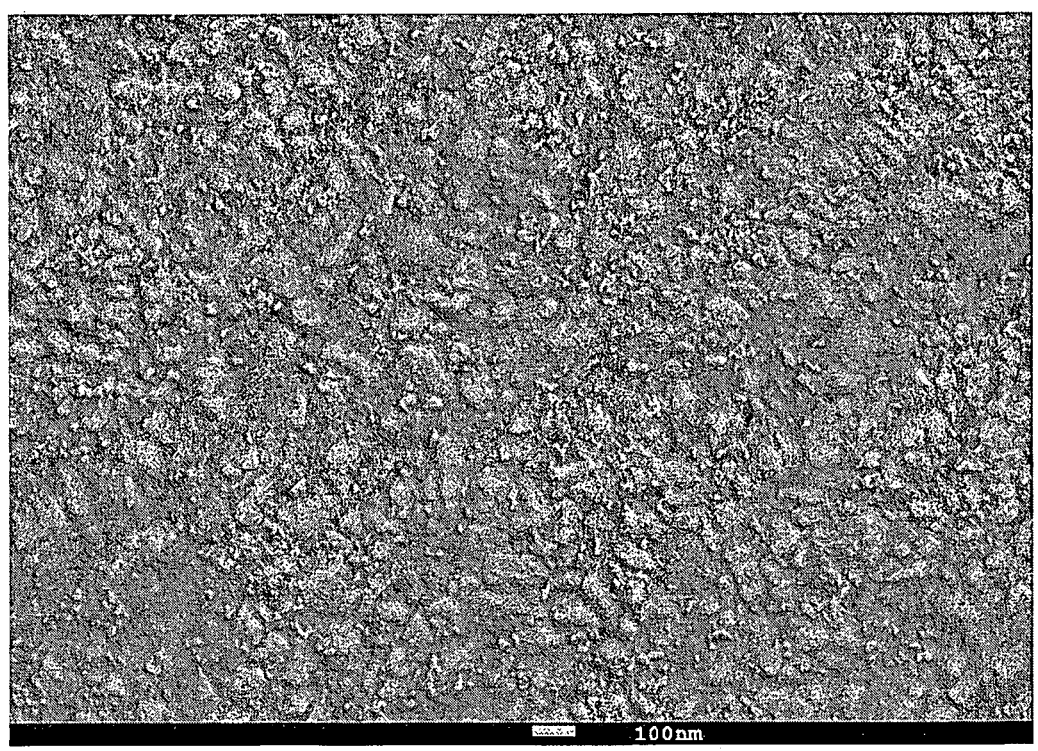
FIG. 4 shows a photograph taken by means of SEM of the sample as described in Example 4—comparative hereunder.

FIG. 4 shows a photograph taken by means of SEM of the sample deposited. The FTO layer is only partially coated. The sample shows a composite morphology consisting of Pt particles having dimensions of 8-10 nm which only partially decorate the conductive substrate following the morphology. A limited and significantly non-homogeneous deposition of Pt is observed.

Example 5—Comparative

Figure 5:
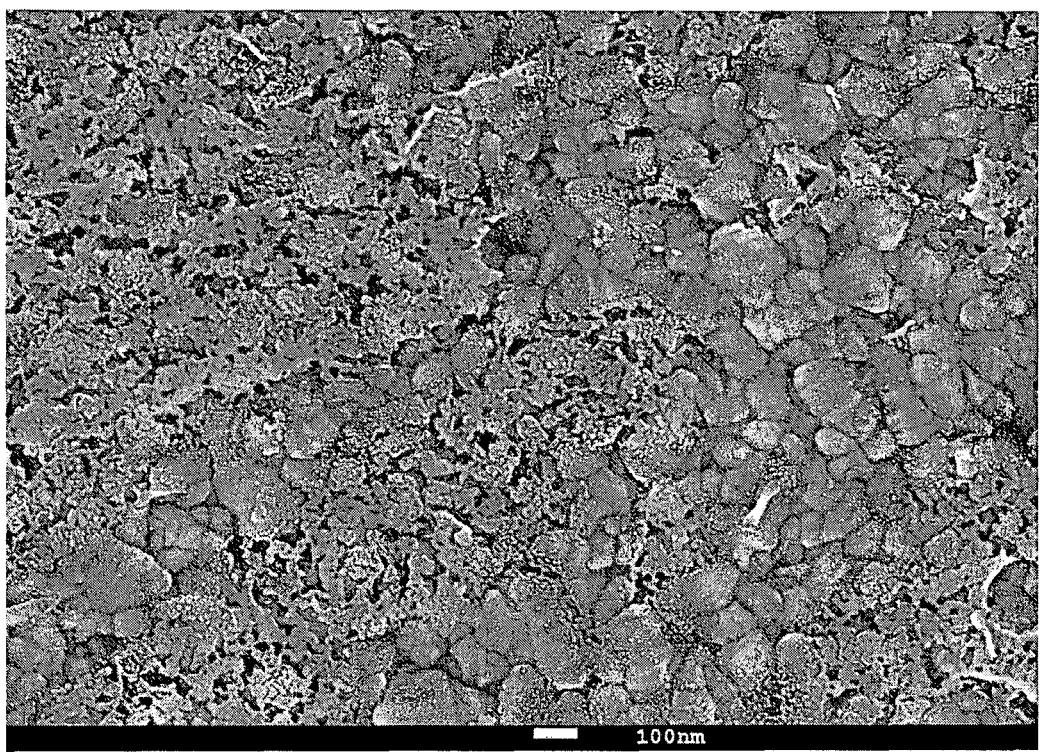
FIG. 5 shows a photograph taken by means of SEM of the sample as described in Example 5—comparative hereunder.

A solution is prepared at 2% by weight of $H_2PtCl_6 \cdot 6H_2O$ in $H_2O$ (boiling point=100° C.). The solution is deposited on a covered FTO conductive glass (FTO glass 25 cm×25 cm TEC 8 2.3 mm) and the glass is put in an oven for 20 hours at 92° C. The cover is removed, the glass slide is cleaned of any possible glue residues of cellotape and is baked in a muffle with a temperature increase to 400° C. in 3 hours and is finally maintained at 400° C. for 1 hour. FIG. 5 shows a photograph taken by means of SEM of the sample deposited. The FTO layer is only partially coated (62%). The sample shows a morphology composed of a layer of nanoaggregates having various dimensions, but in any case <100 nm, consisting of Pt particles of 8-10 nm, non-compact, having a semi-gelatinous morphology, which follows and decorates the substrate of the sample: this layer does not uniformly coat the conductive substrate (FTC), leaving irregularly-shaped holes having sub-micrometric dimensions. The thickness of this layer can be estimated as being around 100 nm.

Example 6—Comparative

Figure 6:
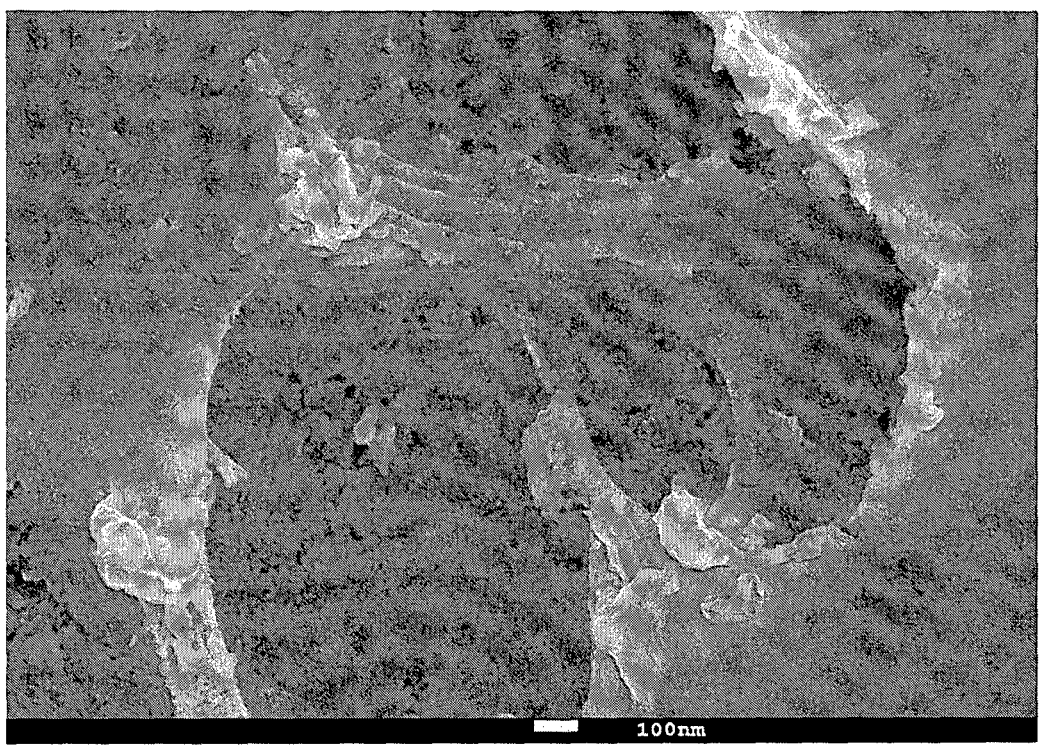
FIG. 6 shows a photograph taken by means of SEM of the sample as described in Example 6—comparative hereunder.

A solution is prepared at 2% by weight of $H_2PtCl_6 \cdot 6H_2O$ in isopropanol (boiling point=82° C.). The solution is deposited on a covered FTO conductive glass (FTO glass 25 cm×25 cm TEC 8 2.3 mm) and the glass is put in an oven for 16 hours at 70° C. The cover is removed, the glass slide is cleaned of any possible glue residues of cellotape and is baked in a muffle with a temperature increase to 400° C. in 3 hours and is finally maintained at 400° C. for 1 hour. FIG. 6 shows a photograph taken by means of SEM of the sample deposited. The FTO layer is completely coated by various layers. The morphology of the sample is characterized by a relatively thick layer (0.5-0.7 mm) of aggregates of Pt particles of 8-10 nm, interrupted by numerous ruffles showing a composite morphology: this layer, in fact, is more compact on the surface and as it approaches the interface with the substrate it acquires a form having interconnected clusters. Numerous extensive holes are present.

Example 7—Activity Test

The cathode prepared according to Example 3 is tested in a DSSC cell, using as photoanode an electrode based on $TiO_2$. The $TiO_2$-based electrodes were prepared by laying (doctor-blade technique) a colloidal paste containing particles of $TiO_2$ having dimensions of 20 nm ($TiO_2$ paste DSL 18NR-T—Dyesol—http://www.dyesol.com/download/MatPaste.pdf) on FTO conductive glass (si-Hartford Glass Co., TEC 8, having a thickness of 2.3 mm and a resistance of 6-9 $\Omega/cm2$), previously washed with water and ethanol. After a first drying at 125° C. for 15 minutes, the sample was calcined at up to 500° C. for 30 minutes. After calcination, the glass coated with the layer of $TiO_2$ was cooled to room temperature and immersed in a solution of dichloromethane ($CH_2Cl_2$) [$5 \times 10^{-4}$ M] of N719 as dye, at room temperature (25° C.), for 24 hours. The glass was then washed with ethanol and dried at room temperature (25° C.) under a stream of $N_2$. A Surlyn spacer having a thickness of 50 microns (TPS 065093-50—Dyesol—http://www.dyesol.com/index.php?element=MattSealarits) was used for sealing the photoanode and the cathode prepared according to Example 3 (Hartford Glass Co., TEC 8, with a thickness of 2.3 mm and a sheet resistance of 6-9 $\Omega/cm2$), the cell was then filled with an electrolytic solution having the following composition: N-methyl-N-butylimidazole iodide (0.6 M), iodine (0.04 M), LiI (0.025 M), guanidinium-thiocyanate (0.05 M) and tert-butylpyridine (0.28 M), in a mixture 15:85 by volume of valeronitrile and acetonitrile. The active area of the cell, calculated by means of microphotography, proved to be equal to 0.1435 $cm^2$. The performances of the photovoltaic cell were measured with a solar simulator (Abet 2000) equipped with a 300 W Xenon light source, the light intensity was regulated with a calibrated silicon standard ("VLSI standard" SRC-1000-RTD-KGS): the performances were measured by the application of a cell tension and measuring the photocurrent generated with a "Keithley 2602A" digital source meter (3A DC, 10A Pulse). The results obtained are indicated hereunder:
Voc (open circuit photovoltage)=750 mV;
FF (Fill Factor)=61%;
$\eta$ (photon-electron conversion efficiency)=4.6%

Example 8—Activity Test

The cathode prepared according to Example 3 is tested in a DSSC cell, using as photoanode an electrode based on $TiO_2$. The $TiO_2$-based electrodes were prepared by laying (doctor-blade technique) a colloidal paste containing particles of $TiO_2$ having dimensions of 20 nm ($TiO_2$ paste DSL 18NR-T—Dyesol—http://www.dyesol.com/download/MatPaste.pdf) on FTO conductive glass (si-Hartford Glass Co., TEC 8, having a thickness of 2.3 mm and a resistance of 6-9 $\Omega/cm2$), previously washed with water and ethanol, immersed in a freshly prepared aqueous solution of $TiCl_4$ ($4.5 \times 10^{-2}$ M), at 70° C., for 30 minutes, and finally washed with ethanol. After a first drying at 125° C. for 15 minutes, a layer of scattering paste containing particles of $TiO_2$ having dimensions >100 nm (Ti-Nanoxide R/SP-Solaronix—http://www.solaronix.com/products/screenprintingtitania/tinanoxidersp/) was laid (doctor-blade technique) over the first layer of $TiO_2$ and sintered up to 500° C. for 30 minutes. The glass coated with $TiO_2$ was cooled to room temperature (25° C.) and immersed again in a freshly prepared aqueous solution of $TiCl_4$ ($4.5 \times 10^{-2}$ M), at 70° C., for 30 minutes, finally washed with ethanol and sintered at 500° C. for 30 minutes. After calcination, the glass coated with the layer of $TiO_2$ was cooled to 70° C. and immersed in a solution of dichloromethane ($CH_2Cl_2$) [$5 \times 10^{-4}$ M] of N719 as dye, at room temperature (25° C.), for 24 hours. The rest of the procedure is identical to that described in example 7. The results obtained are indicated hereunder:
Voc (open circuit photovoltage)=765 mV;
FF (Fill Factor)=68%;
$\eta$ (photon-electron conversion efficiency)=9.4%

Example 9—Activity Test—Comparative

The test of Example 7 was repeated using the cathode prepared as described in Example 4. The results obtained are indicated hereunder:
Voc (open circuit photovoltage)=660 mV;
FF (Fill Factor)=0.21%;
$\eta$ (photon-electron conversion efficiency)=1.1%.

Example 10—Activity Test—Comparative

The test of Example 7 was repeated using the cathode prepared as described in Example 6. The results obtained are indicated hereunder:
Voc (open circuit photovoltage)=685 mV;
FF (Fill Factor)=0.53%;
$\eta$ (photon-electron conversion efficiency)=3.2%.

The invention claimed is:

1. An electrode comprising a conductive substrate on which a uniform layer of aggregates A is deposited, having an average diameter ranging from 40 to 100 nm, on which a non-homogeneous distribution of aggregates B is superimposed, having an average diameter ranging from 300 nm to 1,200 nm, both of said aggregates being composed of particles containing one or more metals selected from platinum, palladium and gold, having an average diameter ranging from 8 to 10 nm.

2. The electrode according to claim 1, wherein the particles contain only one of said metals.

3. The electrode according to claim 1, wherein when two or three of said metals are present both monometallic particles, composed of only one of each of said metals, and multimetallic particles, composed of mixtures having a variable composition of said metals, are contemporaneously present.

4. The electrode according to claim 3, comprising aggregates composed of said monometallic particles that are the same as each other, aggregates composed of said monometallic particles differing from each other with respect to said metals, aggregates composed of said multimetallic particles and aggregates composed of said monometallic particles and said multimetallic particles.

5. The electrode according to claim 1, wherein platinum, palladium and gold are in elemental form.

6. The electrode according to claim 1, wherein said uniform layer of aggregates A is less than 300 nm in thickness.

7. The electrode according to claim 1, wherein the aggregates B have an average diameter ranging from 300 to 600 nm.

8. The electrode according to claim 1, wherein the conductive substrate is selected from glass with conductive coatings, composites based on plastic polymers or metal laminas.

9. A process for the preparation of an electrode comprising a conductive substrate on which a uniform layer of aggregates A is deposited, having an average diameter ranging from 40 to 100 nm, on which a non-homogeneous distribution of aggregates B is superimposed, having an average diameter ranging from 300 nm to 1,200 nm, both of said aggregates being composed of particles containing one or more metals selected from platinum, palladium and gold, having an average diameter ranging from 8 to 10 nm, comprising the following steps:
- (1) dissolving at least one precursor containing platinum, palladium or gold, in a solvent having a boiling point higher than 200° C. to form a solution,
- (2) depositing the solution containing the at least one precursor on the conductive substrate,
- (3) thermally treating the at least one precursor by heating it to a temperature higher than the boiling point of the solvent used.

10. The process according to claim 9, wherein in step (1) the solvent used has a boiling point ranging from 220 to 300° C.

11. The process according to claim 9, wherein the solvent is selected from tetraglyme, glycerine or sulfolane.

12. The process according to claim 9, wherein in step (2) the solution is deposited on the conductive substrate in a thickness of not less than 15 μm.

13. The process according to claim 9, wherein, after depositing the solution, the conductive substrate is heated to a temperature ranging from 60 to 130° C. for a time ranging from 0.5 to 20 hours.

14. The process according to claim 9, wherein in step (3), the thermal treatment is carried out at a temperature at least 100° C. higher than the boiling point of the solvent used in step (1).

15. The process according to claim 14, wherein in step (3) the thermal treatment is carried out at a temperature at least 150° C. higher than the boiling point of the solvent used in step (1).

16. A Dye Sensitized Solar Cell comprising an electrode according to claim 1.

17. The Dye Sensitized Solar Cell of claim 16, wherein said electrode is a cathode.

* * * * *